(12) United States Patent
Doherty et al.

(10) Patent No.: US 12,665,114 B2
(45) Date of Patent: Jun. 23, 2026

(54) CRYOGENIC ANALYTICAL SYSTEMS AND METHODS

(71) Applicant: Montana Instruments Corporation, Bozeman, MT (US)

(72) Inventors: Josh Doherty, Bozeman, MT (US); William Baker, Broomfield, CO (US); Anjan Reijnders, Groton, MA (US)

(73) Assignee: Montana Instruments Corporation, Bozemn, MT (US)

( * ) Notice: Subject to any disclaimer, the term of this patent is extended or adjusted under 35 U.S.C. 154(b) by 279 days.

(21) Appl. No.: 16/918,719

(22) Filed: Jul. 1, 2020

(65) Prior Publication Data

US 2021/0005366 A1      Jan. 7, 2021

Related U.S. Application Data

(60) Provisional application No. 62/869,180, filed on Jul. 1, 2019.

(51) Int. Cl.
*H01F 6/04* (2006.01)
*F17C 3/08* (2006.01)
(Continued)

(52) U.S. Cl.
CPC .............. *H01F 6/04* (2013.01); *F17C 3/085* (2013.01); *F25J 1/0276* (2013.01); *G01N 1/42* (2013.01);
(Continued)

(58) Field of Classification Search
CPC ..... F17C 3/085; F17C 2221/017; G01N 1/42; F25J 1/0276
See application file for complete search history.

(56) References Cited

U.S. PATENT DOCUMENTS

| | | | |
|---|---|---|---|
| 2,793,757 A | 5/1957 | McWethy | |
| 3,236,334 A | 2/1966 | Wallerstein, Jr. | |

(Continued)

FOREIGN PATENT DOCUMENTS

| | | | | |
|---|---|---|---|---|
| CA | 2592600 A1 * | 7/2006 | ............. | F16K 47/08 |
| CN | 103901232 | 7/2014 | | |

(Continued)

OTHER PUBLICATIONS

Rauf, S. Bobby. (2023). Thermodynamics Made Simple for Energy Engineers & Engineers in other Disciplines (2nd Edition)—8.4.1 Isenthalpic or Isoenthalpic Process. River Publishers. Retrieved from https://app.knovel.com/hotlink/pdf/id:kt013DZ1B8/ thermodynamics-made-simple/isenthalpic-or-isoenthalpic (Year: 2023).*
(Continued)

*Primary Examiner* — Jenna M Maroney
(74) *Attorney, Agent, or Firm* — Wells St. John P.S.

(57) ABSTRACT

Cryogenic analytical systems are provided that can include: a cryogenic fluid source; one or more analysis components; at least one cryogenic thermal conduit operably coupled between the cryogenic fluid source and the one or more analysis components; and a pressure control component operably engaged with the cryofluid source. Methods for performing cryogenic analysis are provided. The methods can include adjusting the pressure of cryofluid within a cryogenic fluid source to configure one or more analysis components with a cryogenic temperature. Methods for configuring a cryogenic analytical system to perform cryogenic analysis are also provided. The methods can include: increasing the pressure within a cryogenic fluid source to rapidly cool one or more analysis components to a first temperature; and decreasing the pressure within the cryogenic fluid source to reduce the first temperature of the one or more analysis components.

10 Claims, 10 Drawing Sheets

(51) Int. Cl.
    *F25J 1/02*         (2006.01)
    *G01N 1/42*       (2006.01)
    *H05K 7/20*       (2006.01)

(52) U.S. Cl.
    CPC ....... *H05K 7/2029* (2013.01); *H05K 7/20372*
        (2013.01); *H05K 7/20381* (2013.01); *F17C*
        *2221/017* (2013.01)

(56) References Cited

U.S. PATENT DOCUMENTS

| | | | |
|---|---|---|---|
| 3,415,077 A | 12/1968 | Collins | |
| 3,427,815 A * | 2/1969 | Pitlor | F17C 13/026 |
| | | | 62/217 |
| 3,444,365 A | 5/1969 | Loebe | |
| 3,595,275 A | 7/1971 | Steans et al. | |
| 3,613,387 A | 10/1971 | Collins | |
| 3,894,403 A | 7/1975 | Longsworth | |
| 3,910,277 A | 10/1975 | Zimmer | |
| 3,929,516 A | 12/1975 | Cheskis et al. | |
| 4,011,732 A | 3/1977 | Doherty et al. | |
| 4,036,617 A | 7/1977 | Leonard et al. | |
| 4,161,747 A | 7/1979 | Jennings | |
| 4,242,885 A | 1/1981 | Quack et al. | |
| 4,279,127 A * | 7/1981 | Longsworth | H01F 6/00 |
| | | | 62/298 |
| 4,303,105 A | 12/1981 | Rohner | |
| 4,360,087 A | 11/1982 | Curwen | |
| 4,415,184 A | 11/1983 | Stephenson et al. | |
| 4,543,794 A | 10/1985 | Matsutani et al. | |
| 4,713,942 A | 12/1987 | Hofmann | |
| 4,745,760 A | 5/1988 | Porter | |
| 4,745,761 A | 5/1988 | Bazaj et al. | |
| 4,757,261 A * | 7/1988 | Kneip, Jr. | G01R 33/3815 |
| | | | 62/48.1 |
| 4,790,147 A | 12/1988 | Kuriyama et al. | |
| 4,848,093 A | 7/1989 | Simmonds et al. | |
| 4,854,131 A | 8/1989 | Sakitani et al. | |
| 4,869,068 A | 9/1989 | Van Vloten | |
| 4,968,663 A | 11/1990 | Whang | |
| 5,099,650 A | 3/1992 | Crunkleton | |
| 5,129,232 A | 7/1992 | Minas et al. | |
| 5,148,896 A | 9/1992 | Ralph | |
| 5,327,733 A | 7/1994 | Boolchand et al. | |
| 5,345,769 A | 9/1994 | Liepert et al. | |
| 5,349,823 A | 9/1994 | Solomon | |
| 5,410,910 A | 5/1995 | Somlyo et al. | |
| 5,485,731 A | 1/1996 | Venetucci et al. | |
| 5,552,608 A | 9/1996 | Gallagher et al. | |
| 5,584,184 A | 12/1996 | Inaguchi et al. | |
| 5,613,367 A | 3/1997 | Chen | |
| 5,628,195 A | 5/1997 | Hill et al. | |
| 5,647,228 A * | 7/1997 | Sager | G05D 23/126 |
| | | | 62/51.1 |
| 5,665,314 A | 9/1997 | Berger et al. | |
| 5,737,927 A | 4/1998 | Takahashi et al. | |
| 5,749,243 A | 5/1998 | Lester | |
| 5,755,715 A | 5/1998 | Stern et al. | |
| 5,889,456 A | 3/1999 | Triebe et al. | |
| 5,936,499 A * | 8/1999 | Eckels | G01R 33/3804 |
| | | | 505/892 |
| 5,979,176 A | 11/1999 | Stables et al. | |
| 5,996,638 A | 12/1999 | Schippl | |
| 6,005,964 A | 12/1999 | Reid et al. | |
| 6,196,005 B1 | 3/2001 | Stautner | |
| 6,263,677 B1 | 7/2001 | Hafner et al. | |
| 6,280,688 B1 | 8/2001 | Motz | |
| 6,336,332 B1 | 1/2002 | Cohu | |
| 6,427,778 B1 | 8/2002 | Beall et al. | |
| 7,430,871 B2 | 10/2008 | Strobel | |
| 7,628,536 B2 | 12/2009 | Umemura | |
| 7,932,733 B2 | 4/2011 | Sasajima et al. | |
| 8,066,429 B2 | 11/2011 | Danley | |
| 8,114,321 B2 | 2/2012 | Johnson | |
| 8,671,698 B2 | 3/2014 | Wang | |
| 8,746,008 B1 | 6/2014 | Mauritsen et al. | |
| 8,756,941 B2 | 6/2014 | Snow et al. | |
| 9,134,047 B2 | 9/2015 | Black et al. | |
| 9,243,726 B2 | 1/2016 | Reid et al. | |
| 9,303,914 B2 | 4/2016 | Mauritsen et al. | |
| 9,458,969 B2 | 10/2016 | Prester et al. | |
| 9,618,257 B2 * | 4/2017 | Black | F25D 19/00 |
| 9,620,272 B2 | 4/2017 | Nakayama | |
| 9,821,421 B2 | 11/2017 | Mauriitsen et al. | |
| 10,165,667 B1 | 12/2018 | Christiansen et al. | |
| 10,184,711 B2 | 1/2019 | Stautner et al. | |
| 10,451,529 B2 | 10/2019 | Schreibeis et al. | |
| 10,612,841 B2 | 4/2020 | Kim | |
| 10,775,285 B1 | 9/2020 | Baker et al. | |
| 10,785,891 B1 | 9/2020 | Monroe et al. | |
| 11,047,779 B2 | 6/2021 | Doherty et al. | |
| 11,060,768 B2 * | 7/2021 | Kelly | F25B 9/10 |
| 11,125,663 B1 | 9/2021 | Henslee et al. | |
| 11,125,664 B2 | 9/2021 | Doherty et al. | |
| 11,150,169 B2 | 10/2021 | Reijnders et al. | |
| 11,248,996 B2 | 2/2022 | Doherty et al. | |
| 11,275,000 B2 | 3/2022 | Doherty et al. | |
| 11,309,110 B2 | 4/2022 | Mine et al. | |
| 11,333,408 B2 * | 5/2022 | Takayama | F25B 9/145 |
| 11,480,299 B1 | 10/2022 | Najafi-Yazdi et al. | |
| 12,061,139 B2 | 8/2024 | Croquette et al. | |
| 2001/0023592 A1 | 9/2001 | Odawara et al. | |
| 2003/0177814 A1 | 9/2003 | Weckstrom | |
| 2004/0187519 A1 | 9/2004 | Zhu et al. | |
| 2005/0067159 A1 | 3/2005 | Hall et al. | |
| 2005/0126187 A1 | 6/2005 | Li et al. | |
| 2005/0140959 A1 | 6/2005 | Tsuji et al. | |
| 2005/0204748 A1 | 9/2005 | Yamanaka et al. | |
| 2005/0229609 A1 | 10/2005 | Kirichek et al. | |
| 2006/0148276 A1 | 7/2006 | Renaudin | |
| 2007/0234751 A1 | 10/2007 | Nagamune | |
| 2007/0271933 A1 | 11/2007 | Miki | |
| 2007/0278719 A1 | 12/2007 | Adachi et al. | |
| 2008/0315090 A1 | 12/2008 | Nakasuji et al. | |
| 2009/0094992 A1 | 4/2009 | Wang | |
| 2009/0195980 A1 | 8/2009 | Shih | |
| 2009/0199579 A1 | 8/2009 | Kundig | |
| 2009/0212890 A1 | 8/2009 | Saho et al. | |
| 2009/0224788 A1 | 9/2009 | Sasajima et al. | |
| 2009/0272127 A1 | 11/2009 | Radovinsky et al. | |
| 2010/0050661 A1 | 3/2010 | Snow et al. | |
| 2011/0219785 A1 * | 9/2011 | Black | F25D 19/006 |
| | | | 62/3.1 |
| 2012/0011859 A1 * | 1/2012 | Black | F25D 19/00 |
| | | | 62/48.1 |
| 2012/0031110 A1 | 2/2012 | Tanaka | |
| 2012/0096873 A1 | 4/2012 | Webber et al. | |
| 2013/0021032 A1 | 1/2013 | Heiss et al. | |
| 2013/0047633 A1 * | 2/2013 | Leach | G01R 33/282 |
| | | | 62/51.1 |
| 2013/0179090 A1 | 7/2013 | Conroy | |
| 2014/0007596 A1 | 1/2014 | Prester et al. | |
| 2014/0130520 A1 | 5/2014 | Snow et al. | |
| 2014/0202174 A1 * | 7/2014 | Wang | F25B 9/145 |
| | | | 62/6 |
| 2014/0245757 A1 | 9/2014 | Garside et al. | |
| 2014/0248649 A1 | 9/2014 | Mayer et al. | |
| 2015/0248002 A1 | 9/2015 | Ingersoll et al. | |
| 2015/0252799 A1 | 9/2015 | Roscher | |
| 2015/0300719 A1 * | 10/2015 | Strickland | F25B 25/005 |
| | | | 62/62 |
| 2015/0323626 A1 | 11/2015 | Jonas et al. | |
| 2015/0332829 A1 * | 11/2015 | Stautner | F25B 9/10 |
| | | | 324/318 |
| 2015/0338151 A1 | 11/2015 | Miki | |
| 2015/0355091 A1 | 12/2015 | Conroy | |
| 2016/0123537 A1 | 5/2016 | Heiss et al. | |
| 2016/0298888 A1 | 10/2016 | Khatri et al. | |
| 2017/0168121 A1 | 6/2017 | Yu et al. | |
| 2017/0261413 A1 | 9/2017 | Schreibeis et al. | |
| 2017/0323764 A1 | 11/2017 | Muto et al. | |
| 2019/0025166 A1 | 1/2019 | Schreibeis et al. | |
| 2019/0162777 A1 | 5/2019 | Chiang et al. | |
| 2019/0170620 A1 | 6/2019 | Reijnders et al. | |

(56)                    References Cited

U.S. PATENT DOCUMENTS

| | | | |
|---|---|---|---|
| 2019/0170621 A1 | 6/2019 | Doherty et al. | |
| 2019/0170623 A1 | 6/2019 | Doherty et al. | |
| 2019/0170624 A1 | 6/2019 | Doherty et al. | |
| 2020/0109764 A1 | 4/2020 | Motley et al. | |
| 2020/0149686 A1* | 5/2020 | Neils ..................... F17C 13/086 | |
| 2020/0265963 A1 | 8/2020 | Wong | |
| 2021/0278745 A1 | 9/2021 | Groeblacher et al. | |
| 2021/0326739 A1 | 10/2021 | Jeffrey | |
| 2022/0092459 A1 | 3/2022 | Bogorin et al. | |
| 2022/0237495 A1 | 7/2022 | Yohannes et al. | |
| 2023/0155593 A1 | 5/2023 | Abdo et al. | |

FOREIGN PATENT DOCUMENTS

| | | | | |
|---|---|---|---|---|
| CN | 107906844 A | * | 4/2018 | ............ F25B 19/005 |
| DE | 102018130882 A1 | * | 6/2019 | ............. F17C 3/085 |
| EP | 0619440 | | 10/1994 | |
| FR | 3023900 A1 | * | 1/2016 | ............. F17C 3/085 |
| GB | 2457054 A | * | 8/2009 | ............. F25D 19/00 |
| GB | 2566024 A | * | 3/2019 | ............. F17C 13/007 |
| JP | S6168547 | | 4/1986 | |
| JP | 05059503 A | | 3/1993 | |
| JP | H06-341487 A | | 12/1994 | |
| WO | WO-2017055865 A2 | * | 4/2017 | ................ F25B 9/10 |
| WO | WO 2018/168304 | | 2/2018 | |

OTHER PUBLICATIONS

WO PCT/US2019/55449 IPRP, Apr. 8, 2021, Montana Instruments Corp.

WO PCT/2019/55449 IPRP, Apr. 8, 2021, Montana Instruments Corp.

WO PCT/2019/55449 Search Rpt, Jan. 8, 2020, Montana Instruments Corp.

WO PCT/2019/55449 Writ Opin, Jan. 8, 2020, Montana Instruments Corp.

Majorana et al., "Vibration Free Cryostat for cooling suspended mirrors", Journal of Physics: Conference Series 32, (2006), pp. 374-379.

Mueller Copper 1100 (Electrolytic Tough Pitch Copper), Alloy Digest, 1983, 2 pages.

Snow, U.S. Appl. No. 61/136,138, filed Aug. 14, 2008, titled "Apparatus(es) & Methods for Improving Vibration Isolation, Thermal Dampening, Optical Access in Cryogenic Refrigerators", 18 pages.

Wang et al., "A Compact Cold Helium Circulation System with GM Cryocooler", 2014, United States, 6 pages.

White, G.K., "The Thermal and Electrical Conductivity of Copper at Low Temperatures", 1953, pp. 398-404.

http://coldedgetech.com/stinger ColdEdge Technologies, Jun. 11, 2017; United States, 6 pages.

RC102-CFM Microscopy Cryostat System Brochure, Cryo Industries of America, Inc., Sep. 3, 2013; United States, 14 pages.

EP EP 24208699 Ext. Search Rept., Mar. 27, 2025, Montana Instruments Corp.

Tian, et al., "Low Vibration high NA automated variable temperature Raman microscope", arxiv.org, Cornell University Library, 201 Olin Library Cornell University, Ithaca NY 14853, Apr. 8, 2016, XP080694310, United States, 11 pages.

* cited by examiner

CRYOGENIC ANALYTICAL SYSTEMS AND METHODS

CROSS REFERENCE TO RELATED APPLICATION

This application claims priority to and the benefit of U.S. Provisional Patent Application Ser. No. 62/869,180 filed Jul. 1, 2019, entitled "Cryogenic Analytical Systems and Methods", the entirety of which is incorporated by reference herein.

TECHNICAL FIELD

The present disclosure relates to cryogenic analytical systems and methods. In particular embodiments, the disclosure provides systems and methods that leverage regulating cryofluid pressure.

BACKGROUND

Analytical systems can provide extremely low temperatures to both samples and/or analysis components in order to perform sample analysis under different environments. Cryogenic analysis determines sample characteristics under extremely low temperatures. Sample throughput can be a paramount need which requires high cooling power to achieve a quick cooldown. Achieving as low a base temperature as possible can also be desired.

Cryogenic fluids, including liquid and/or gaseous helium or nitrogen, are commonly used as sources to remove heat from a component to thereby reduce the temperature of the component. As commonly performed, a cryogenic fluid is delivered from a source of cryogenic fluid to an analysis component. By controlling the rate at which the cryogenic fluid is delivered to the analysis component, one can affect it's rate of cooling. Higher flow rates are desired for more rapid cooling (i.e. faster cooldown time), whereas lower flow rates are desired for more rapid warming (i.e. faster warmup time).

Existing methods of controlling cryogenic fluid flow can put heat into the system that reduces cooling power and/or increases the temperature of the cryogenic fluid source. Other methods to stop the flow of cryogenic fluid involve cryogenic valves, which are often large in size relative to the cryogenic fluid thermal conduit and in thermal communication with warmer temperature components, which reduces cooling power or increases the temperature of the cryogenic fluid due to additional radiation and/or conduction loads. The present disclosure overcomes at least some of the shortfalls and avoids the complexity in design of existing systems and/or methods.

SUMMARY

Cryogenic analytical systems are provided that can include: a cryogenic fluid source; one or more analysis components; at least one cryogenic thermal conduit operably coupled between the cryogenic fluid source and the one or more analysis components; and a pressure control component operably engaged with the cryofluid source.

Methods for performing cryogenic analysis are provided. The methods can include adjusting the pressure of cryofluid within a cryogenic fluid source to configure one or more analysis components with a cryogenic temperature.

Methods for configuring a cryogenic analytical system to perform cryogenic analysis are also provided. The methods can include: increasing the pressure within a cryogenic fluid source to rapidly cool one or more analysis components to a first temperature; and decreasing the pressure within the cryogenic fluid source to reduce the first temperature of the one or more analysis components.

DRAWINGS

Embodiments of the disclosure are described below with reference to the following accompanying drawings.

Figure 6:
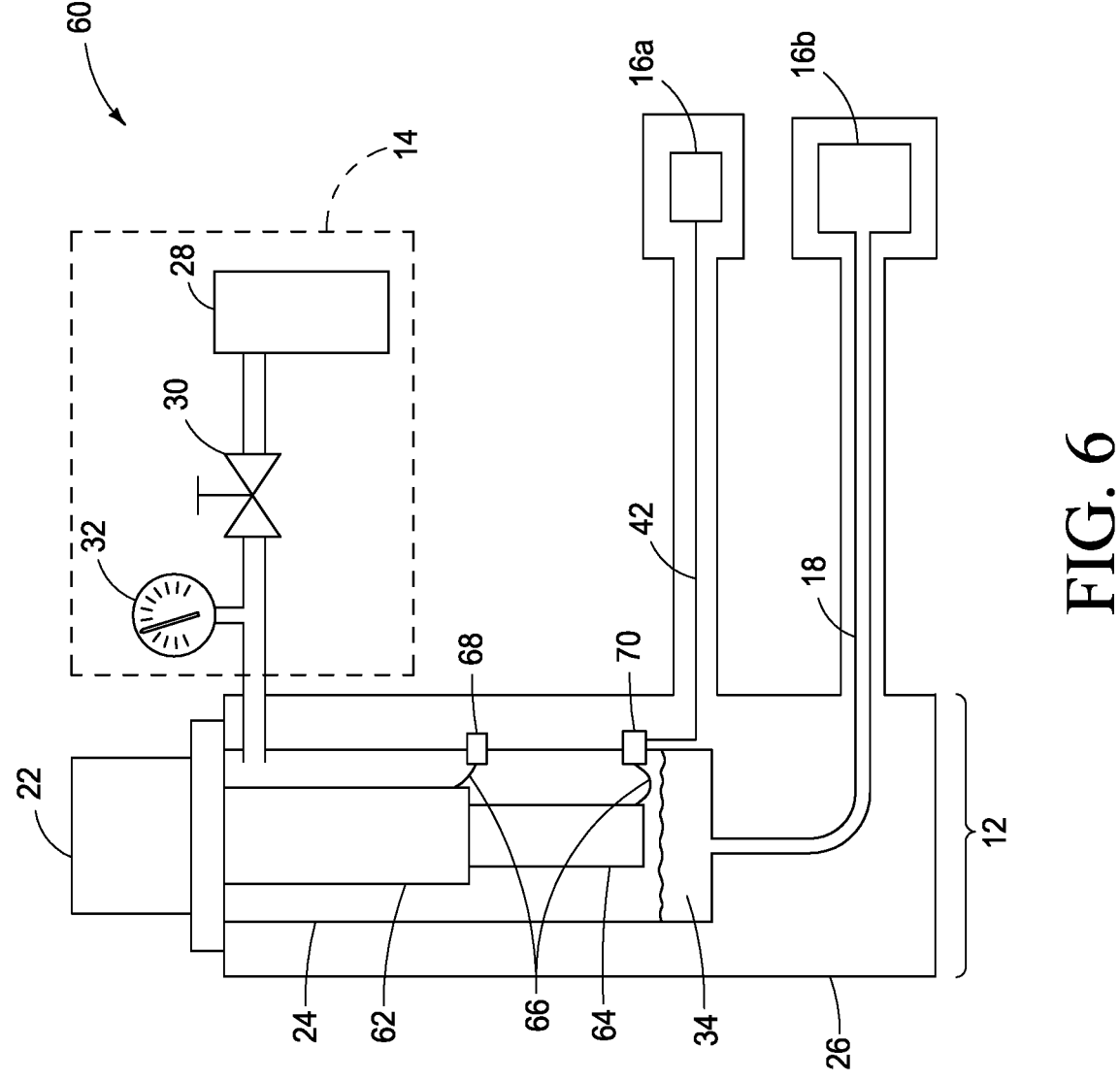
FIG. 6 is another cryogenic analytical system according to an embodiment of the disclosure.
Figure 7A:
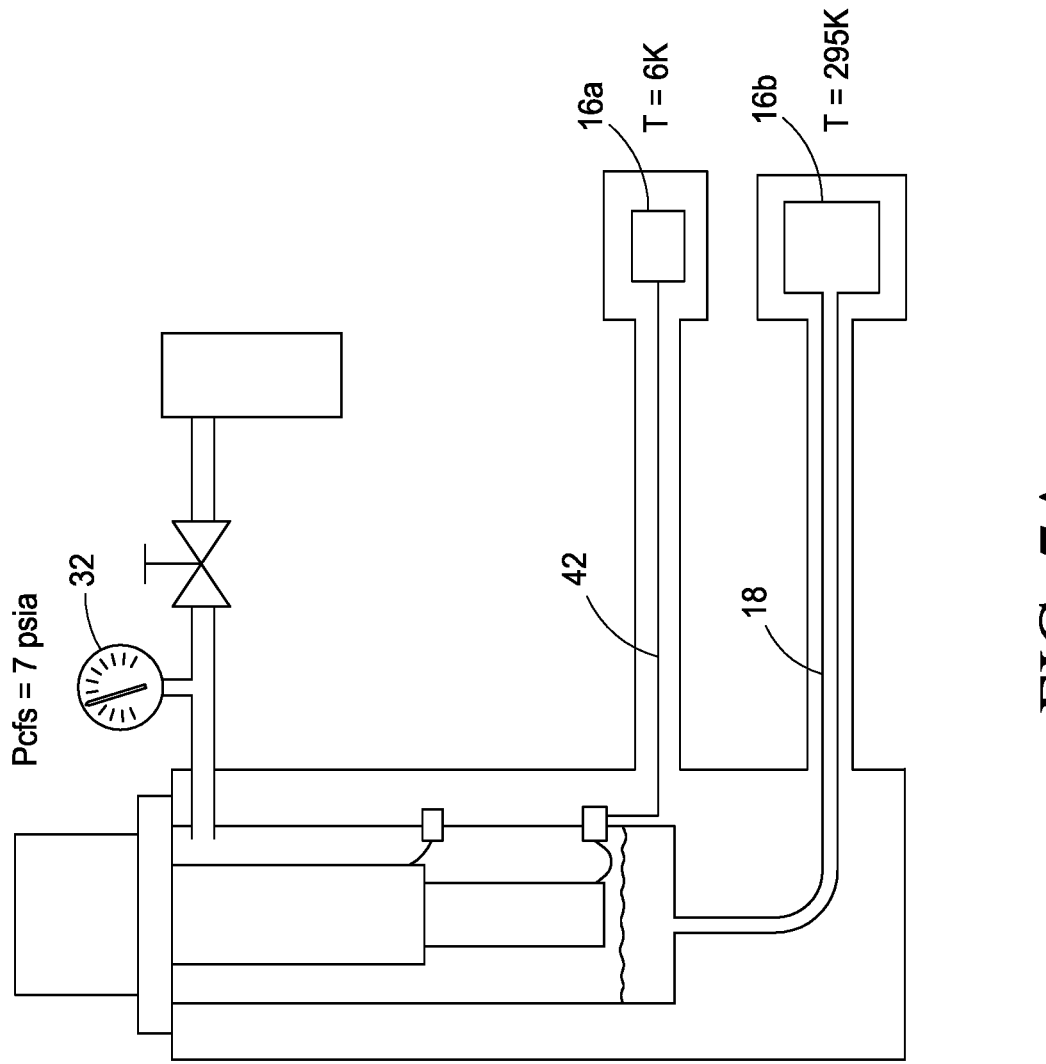
FIG. 7A is the cryogenic analytical system of FIG. 6 in at least one configuration according to an embodiment of the disclosure.
Figure 7B:
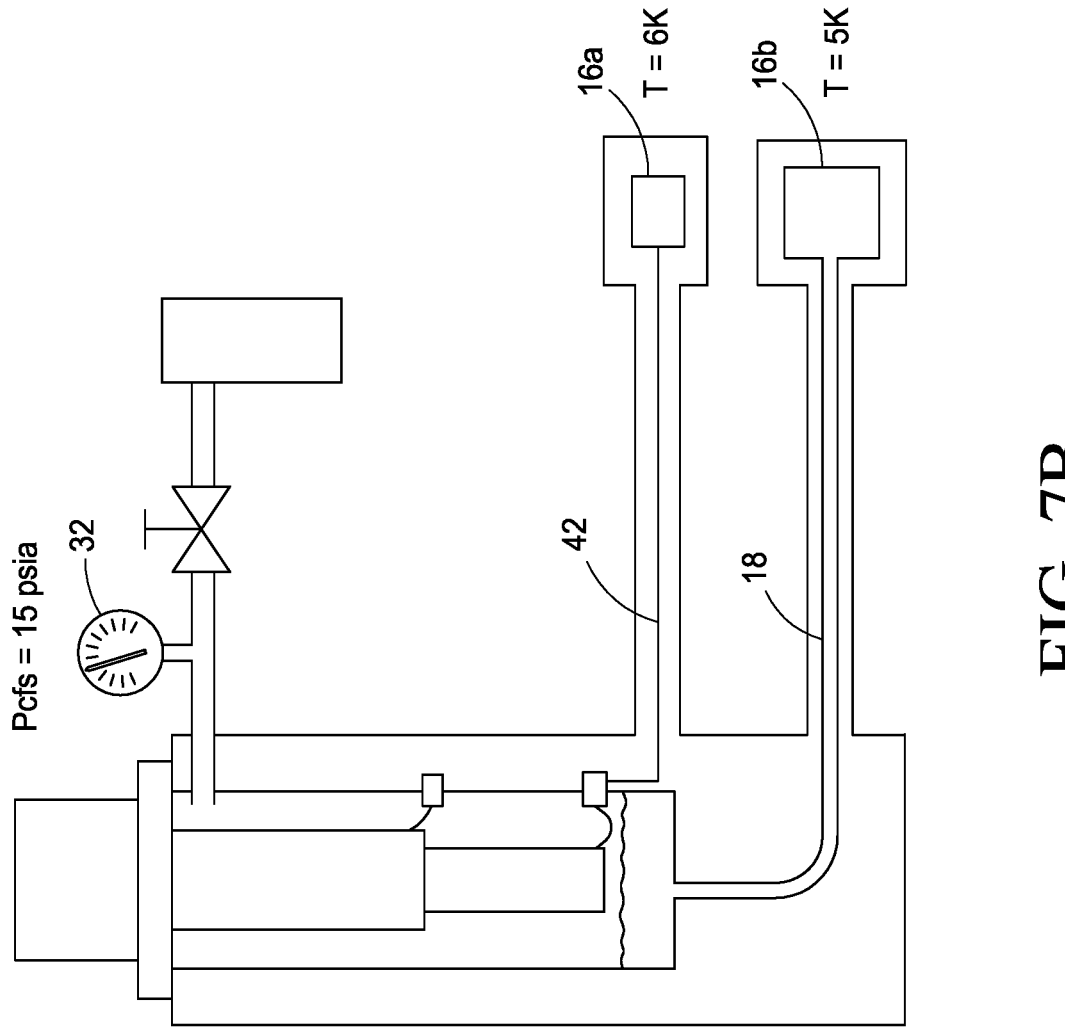
FIG. 7B is the cryogenic analytical system of FIG. 6 in at least another configuration according to an embodiment of the disclosure.
Figure 7C:
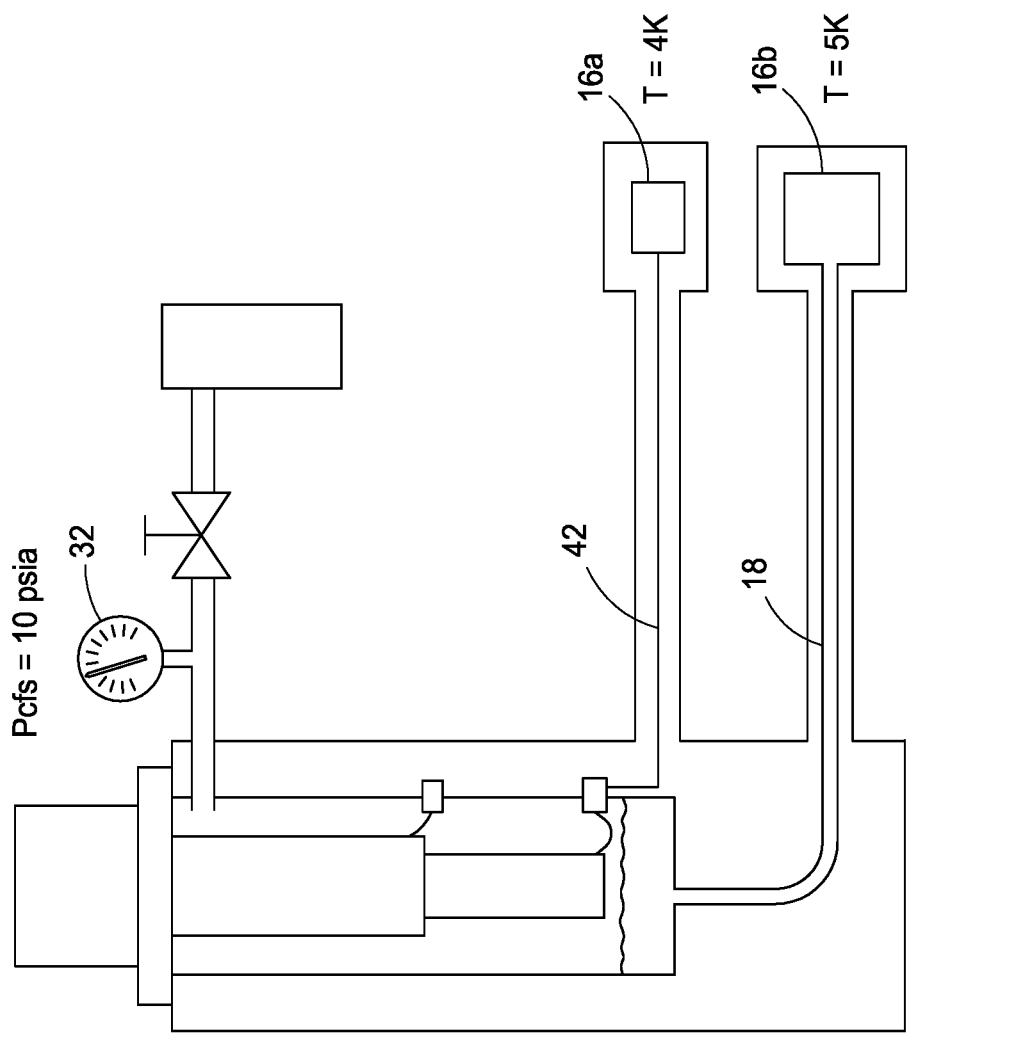

FIG. 7C the cryogenic analytical system of FIG. 6 in still another configuration according to an embodiment of the disclosure.

Figure 8:
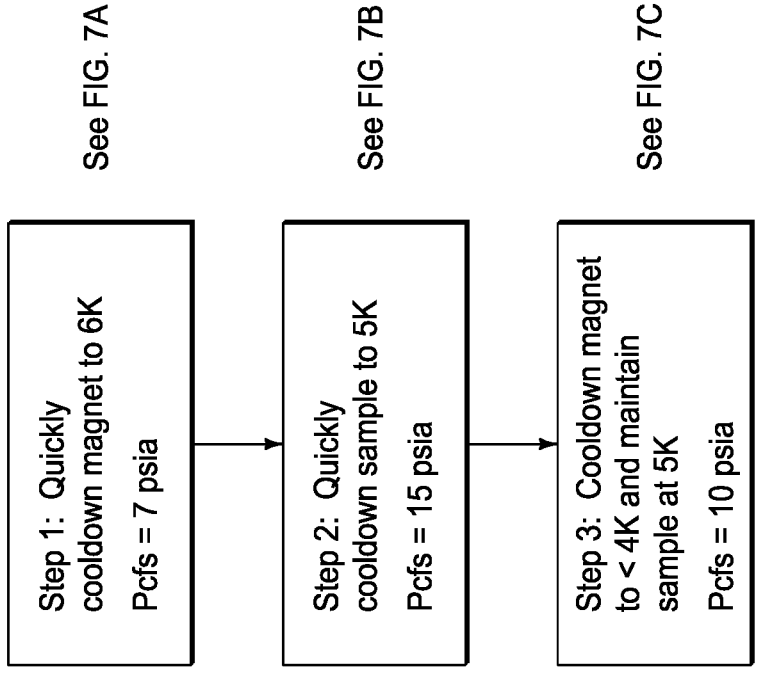

FIG. 8 is a depiction of cryogenic cool down method steps according to an embodiment of the disclosure.

DESCRIPTION

This disclosure is submitted in furtherance of the constitutional purposes of the U.S. Patent Laws "to promote the progress of science and useful arts" (Article 1, Section 8).

Figure 1:
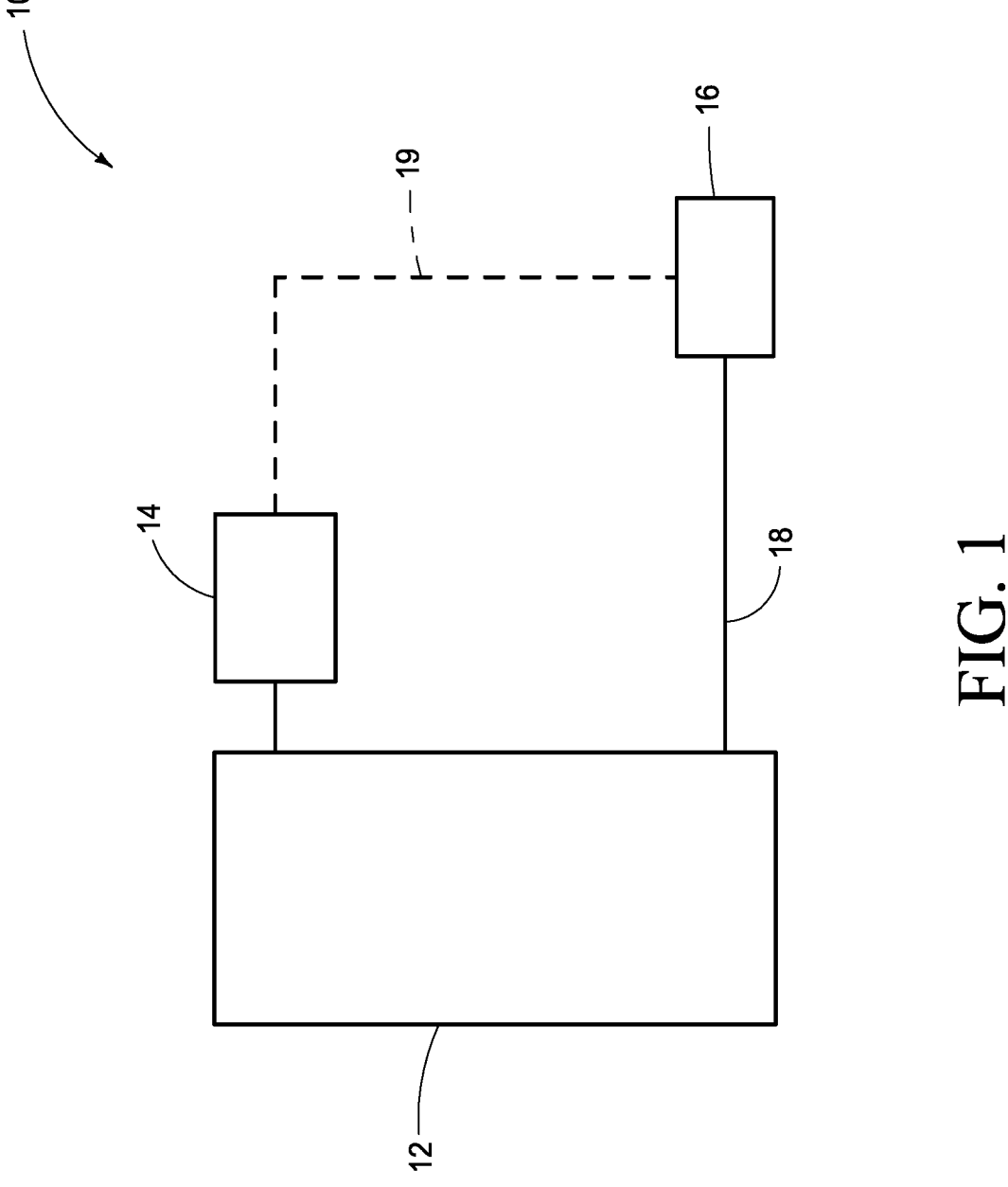
FIG. 1 is a cryogenic analytical system according to an embodiment of the disclosure.

The systems and methods of the present disclosure will be described with reference to FIGS. 1-8. Referring first to FIG. 1, a cryogenic analytical system 10 is shown that can include a cryogenic fluid source 12 operatively engaged with a pressure control component 14 which is operatively engaged with an analysis component 16. System 10 can be configured with a cryogenic fluid thermal conduit 18 operatively engaging source 12 and component 16. Cryogenic fluid source pressure can be varied to cause a preferred temperature regulation effect on analysis component 16 that is cooled by the transfer of cryogenic fluid from cryogenic fluid source 12 through cryogenic fluid thermal conduit 18 to analysis component 16.

Cryogenic fluid source 12 can be any component capable of storing or generating cryogenic fluid. For example, source 12 can include a dewar that can hold or store cryogenic fluid. As another example, source 12 can be a liquefier or liquefaction system that cools fluid in contact with a mechanical cryocooler to create cryogenic fluid. The liquefier can, for example, include a mechanical cryocooler with a bucket/sock around the cryocooler that seals fluid within and a vacuum housing around the bucket/sock. Fluid input to the bucket/sock can be cooled by the cryocooler creating a cryogenic fluid that collects in the bucket/sock.

Cryogenic fluid source 12 can contain a finite amount of cryogenic fluid such that the method and system can only be used for a finite duration or may contain a replenishable source of cryogenic fluid and thereby place no restriction on the duration of the method or system. Cryogenic fluid source 12 can be used in an open-loop or closed-loop fashion.

Analysis component 16 can be in thermal communication with the cryogenic fluid source 12. Analysis component 16 can be in thermal communication via a solid conduction thermal conduit or a cryogenic fluid thermal conduit. Analysis component 16 can, for example, include a platform that regulates/controls the temperature of a sample being analyzed. The component can be configured to maintain the sample under predetermined conditions of pressure and/or temperature. In some circumstances the sample is maintained under vacuum. Component 16 can be any mass within a temperature control instrument used for radiation shielding, thermal lagging, and/or sample mounting. Component 16 can also include, for example, a superconducting magnet that must be cooled below a specific temperature to operate.

Pressure control component 14 can be operable to increase and/or decrease the pressure of the fluid within the cryogenic fluid source 12. Component 14 can be operably coupled to a cryofluid inlet or as part of a cryofluid outlet or both. Pressure control component 14 can be configured as a variable valve that is operable between fully opened to fully closed positions to maintain a desired pressure. Pressure control component 14 can also include a pump or pressure relief valve that decreases the pressure of cryogenic fluid source 12. Pressure control component 14 can also be configured to include a compressor or a source of high pressure fluid that can feed into and raise the pressure of cryogenic fluid source 12.

Pressure control component 14 can be configured to include a feedback mechanism. The mechanism can include receiving a control signal, for example from analysis component 16; the signal can relate to temperature within analysis component 16. The signal can be used to vary the position of a proportional valve within component 14 to adjust the pressure of cryogenic fluid source 12 to reach and maintain a desired temperature within analysis component 16.

Cryogenic fluid thermal conduit 18 can be configured to operably extend between cryogenic fluid source 12 and analysis component 16. Cryogenic fluid thermal conduit 18 can be operable to transport cryogenic fluid from cryogenic fluid source 12 to the analysis component 16. Cryogenic fluid thermal conduit 18 could, for example, be a capillary or impedance tube made of a polymer such as plastic or PEEK, copper, stainless steel, aluminum, or other metal alloy.

The mass flow rate of cryogenic fluid from cryogenic fluid source 12 to analysis component 16 through cryogenic fluid thermal conduit 18 can be regulated by manipulating: 1) pressure of the cryogenic fluid source, 2) pressure of the analysis component, 3) the resistance to flow of the cryogenic fluid thermal conduit, and/or 4) properties of the cryogenic fluid (density, viscosity, quality for example) that are pressure and temperature dependent. Cryogenic fluid thermal conduit 18 can be specifically tuned by providing a specific diameter and/or length for example, to support a desired range of pressure-dependent mass flow rates of cryogenic fluid from cryogenic fluid source 12 to analysis component 16.

The method and system disclosed herein rely on controlling the cryogenic fluid source pressure to change at least one of the following:

Mass flow rate of cryogenic fluid: By changing the pressure of cryogenic fluid source 12, the mass flow rate of cryogenic fluid from cryogenic fluid source 12 to analysis component 16 can be varied. Increasing the pressure of cryogenic fluid source 12 can increase the flow rate, which may be desirable to achieve a faster cooldown time and/or increased cooling power of analysis component 16. Conversely, decreasing the pressure of cryogenic fluid source 12 can reduce the mass flow rate of cryogenic fluid to analysis component 16, which may be desirable to achieve a lower temperature of analysis component 16, for example.

Temperature of cryogenic liquid: At saturation conditions, when a liquid and vapor phase coexist in equilibrium, the temperature of the liquid is dependent upon the cryogenic fluid source pressure and can be determined according to the saturation temperature vs. saturation pressure relationship of the cryogenic fluid. At roughly 14 psia for example, the temperature of saturated helium-4 (He4) liquid is 4.2K. At a lower cryogenic fluid source pressure, a lower temperature saturated liquid will exist.

In cases where the cryogenic fluid is pumped on (reduced pressure applied to), for example to lower the pressure and associated temperature of the cryogenic fluid, the pressure obtained (and corresponding temperature) depends on the mass flow rate of cryogenic fluid. At reduced mass flow rates, a pump can reach lower pressures thereby enabling a lower temperature cryogenic fluid to be achieved. As long as enough cryogenic fluid is delivered to meet the heat loads on the analysis component, a lower temperature cryogenic fluid may be desired for example to reach a lower base temperature of an analysis component cooled by the cryogenic fluid.

Liquefaction rate of cryogenic fluid: In liquefiers or liquefaction systems, the rate at which the liquid is produced (liquefaction rate) can be dependent upon the cryogenic fluid source pressure. Within some range, liquefaction rates generally increase with increasing cryogenic fluid source pressure (e.g. the pressure of the fluid in thermal contact with the cryocooler).

The systems and methods of the present disclosure can use pressure control component 14 to control the pressure of cryogenic fluid source 12 to ultimately achieve a desired temperature regulation effect at analysis component 16. The temperature regulation may be a specific temperature, cooling power, or cooling rate for example. Dashed line 19 of FIG. 1 indicates the control (via signal transmission) of analysis component by the pressure control component via communication between the two components.

Figure 2:
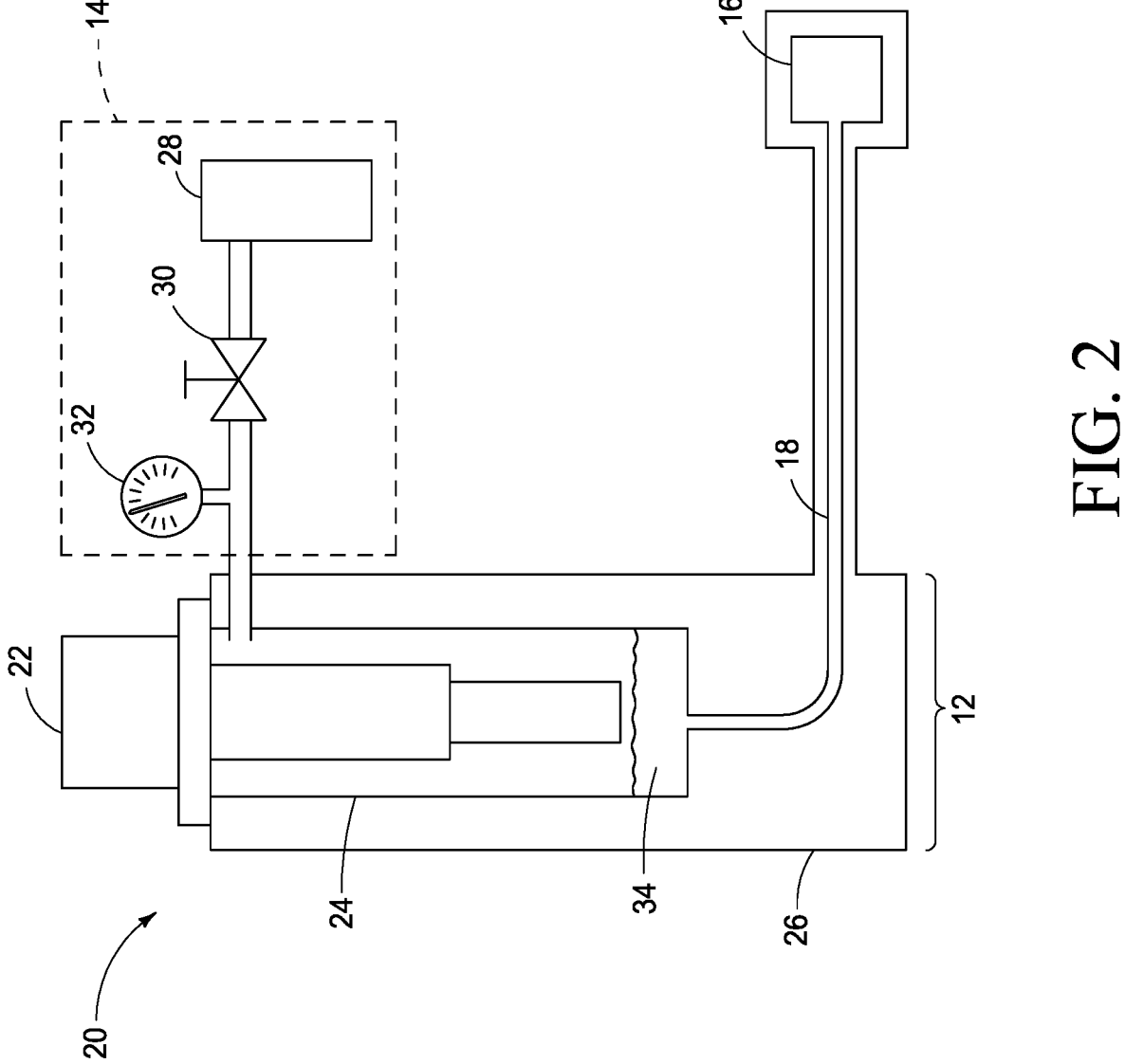
FIG. 2 is another cryogenic analytical system according to an embodiment of the disclosure.

Referring next to FIG. 2, another system 20 is depicted to include cryogenic fluid source 12 configured as a liquefier to include a cryocooler 22 inside a bucket assembly 24 that is inside a vacuum housing 26. Pressure control component 14 can include a gas container, of helium for example, 28, an adjustable valve 30, and a pressure gauge 32. Adjustable valve 30 can be adjusted to deliver gaseous helium gas from the gas container 28 to bucket assembly 24 and the cryogenic fluid source pressure measured by pressure gauge 32. Cryocooler 22 condenses gaseous helium gas to create a cryogenic fluid that collects in a bottom 34 of bucket assembly 24. Cryogenic fluid in bucket assembly 24 is then transported to analysis component 16 through cryogenic fluid thermal conduit 18.

In one embodiment, the method and system described herein can be applied to quickly cool an analysis component by operating cryogenic fluid source 12 at a relatively high pressure, for example 15 psia. Once the analysis component 16 is relatively cold, cryogenic fluid source 12 can then be operated at 10 psia to reduce the mass flow rate through cryogenic fluid thermal conduit 18 and thereby achieve a lower base temperature at analysis component 16. In accordance with example implementations, this can be achieved using a cryogenic fluid thermal conduit that can include a single impedance tube with a diameter and length specifically chosen to provide the desired mass flow rates at the two operating pressures.

In another embodiment, pressure control component 14 may be used to reduce the pressure of cryogenic fluid source 12 beyond a threshold at which the mass flow of cryogenic fluid may be stopped or at least sufficiently enough as to deliver essentially zero amount of cryogenic fluid to analysis component 16. With zero flow, or at least not enough as required to meet the heat loads, the temperature of the analysis component 16 can be increased more quickly, which may be desired for example when warming up the analysis component to change out a sample.

Figure 3:
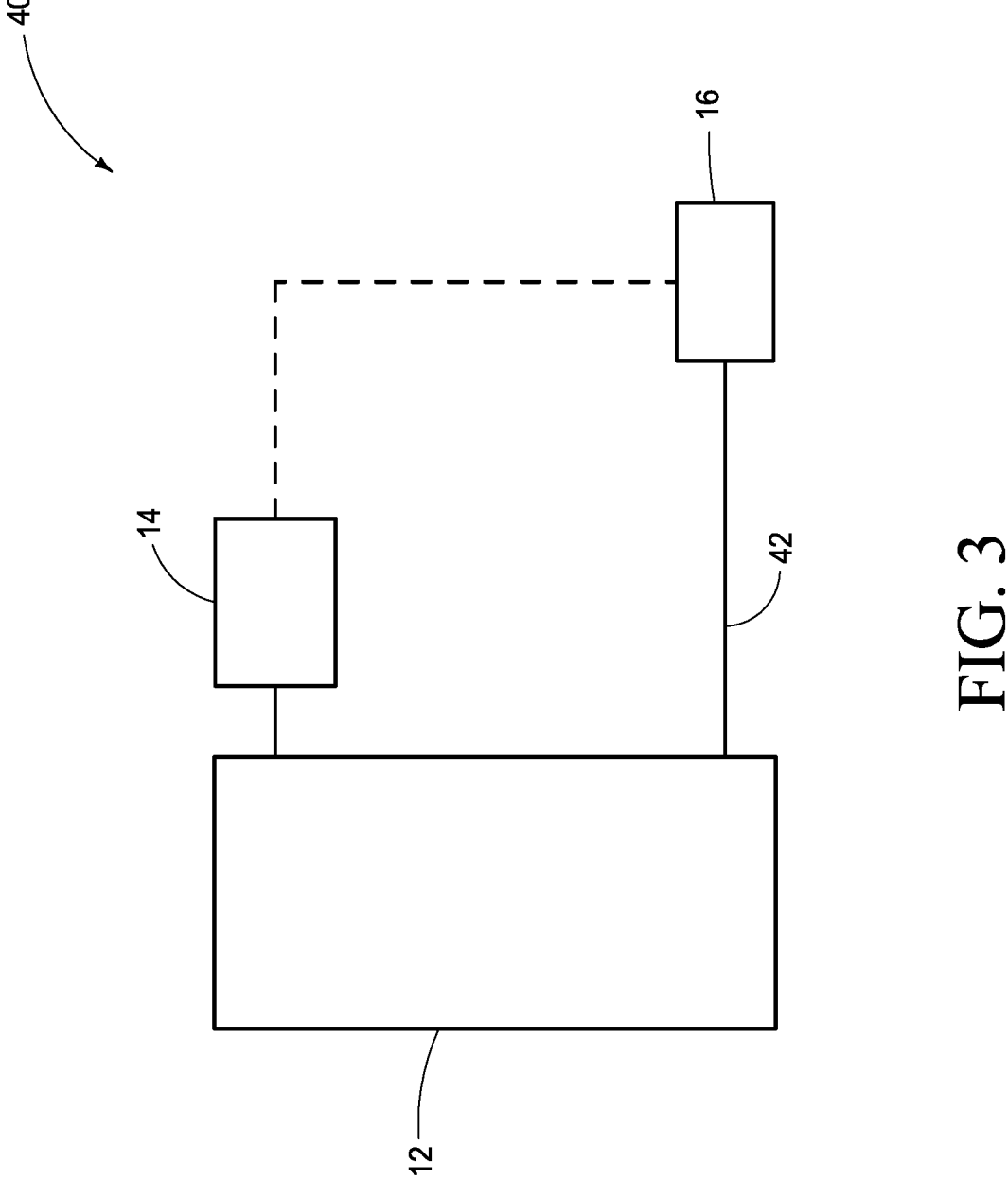
FIG. 3 is another cryogenic analytical system according to an embodiment of the disclosure.

Referring next to FIG. 3, system 40 is shown configured in accordance with another embodiment of the disclosure. Accordingly, system 40 can include a solid conduction thermal conduit 42 operatively aligned between cryogenic fluid source 12 and analysis component 16. The methods and systems of controlling the cryogenic fluid source pressure may also be used to achieve a desired temperature regulation effect (specific temperature, cooling power, or cooling rate) of an analysis component in thermal communication with the cryogenic fluid source via a solid conduction thermal conduit 42.

Figure 4:
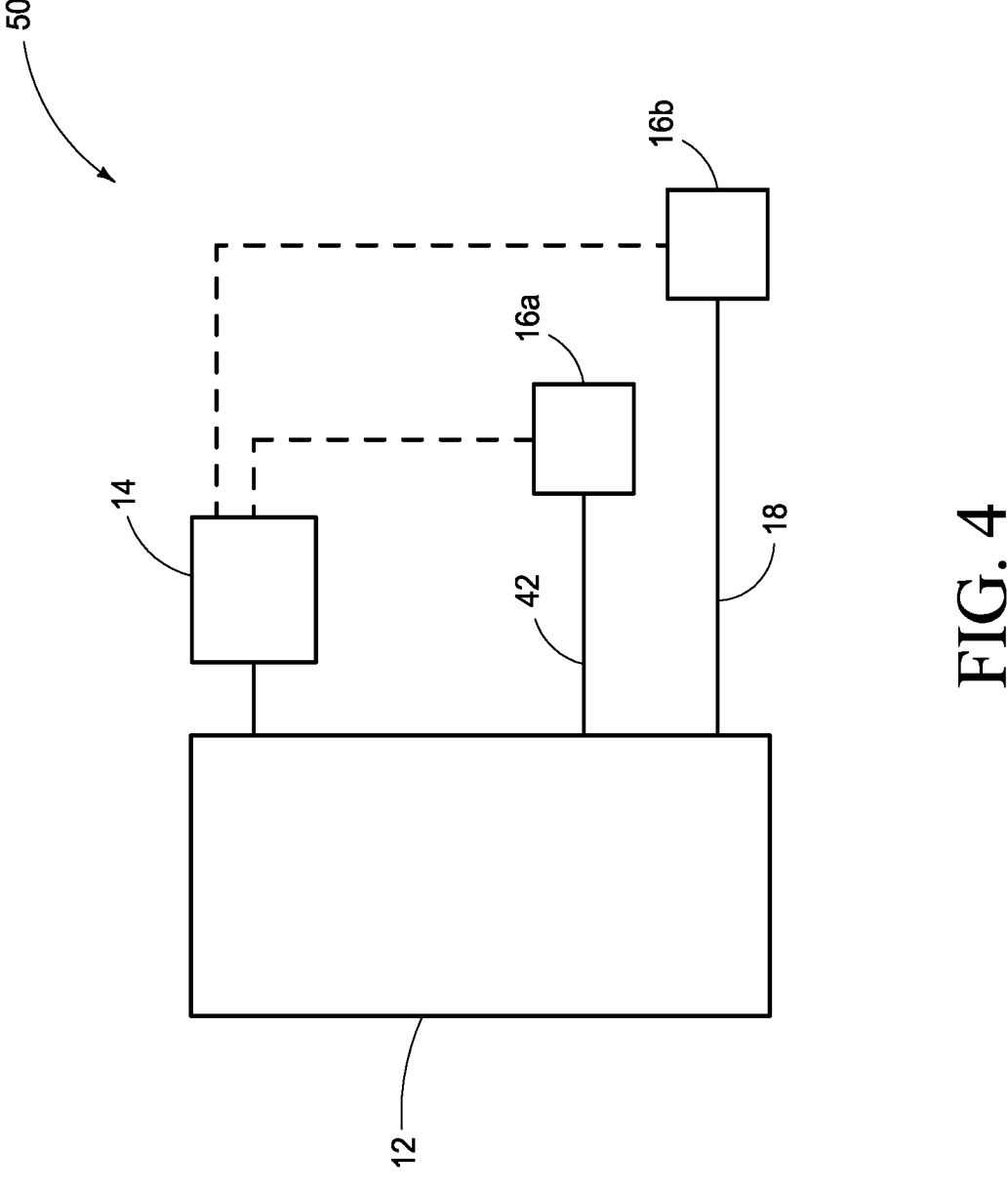
FIG. 4 is another cryogenic analytical system according to an embodiment of the disclosure.
Figure 5:
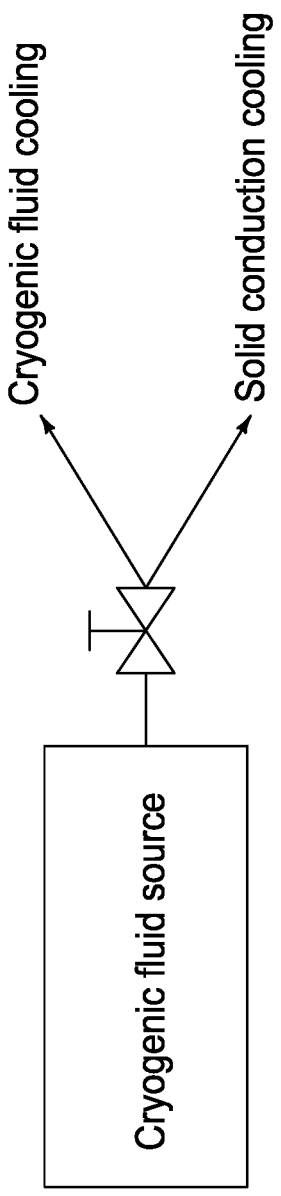
FIG. 5 is a portion of a cryogenic analytical system according to an embodiment of the disclosure.

Referring next to FIG. 4, system 50 is depicted. System 50 can include both an analysis component 16a in thermal communication with cryogenic fluid source 12 via solid conduction thermal conduit 42 and an analysis component 16b that is in thermal communication with cryogenic fluid source 12 via cryogenic fluid thermal conduit 18.

In accordance with the systems of FIG. 4, cryogenic fluid source 12 includes a liquefier or liquefaction system with a mechanical cryocooler rated to a predetermined cooling capacity, a portion of this capacity is being applied to solid conduction cooling (via solid conduction thermal conduit 42) and another portion for cryogenic fluid cooling (via cryogenic fluid thermal conduit 18). In accordance with an example depiction shown in FIG. 5, controlling the cryogenic fluid source pressure in such systems as shown in FIG. 4 can be analogous to turning a valve that controls how much of the cryogenic fluid source's cooling power is applied to cryogenic fluid cooling and what remaining percent is applied to solid conduction cooling.

As previously described, the mass flow rate and temperature of the cryogenic fluid delivered by cryogenic fluid source 12 can be dependent on the pressure of cryogenic fluid source 12, thereby allowing pressure control component 14 to be varied to achieve a desired effect at analysis component 16 with cryogenic fluid thermal conduit 18. More so, the cooling power not applied to the cryogenic fluid cooling is directed to solid conduction cooling enabling the cryogenic fluid source pressure to be varied to effect changes in analysis component 16 in thermal communication with cryogenic fluid source 12 via solid conduction thermal conduit 42. At increased cryogenic fluid source pressures, cryocooler 22 in cryogenic fluid source 12 can input more cooling power towards creating and maintaining cryogenic fluid than it will at lower pressures, where the efficiency of cryocooler 22 to cool cryogenic fluid is reduced. Less cooling power is available for solid conduction at increased cryogenic fluid source pressures than at lower pressures. A lower cryogenic fluid source pressure can be preferred for solid conduction cooling and a higher cryogenic fluid source pressure can be preferred for cooling with the cryogenic fluid.

Referring next to FIG. 6, system 60 is shown that includes solid conduction thermal conduit 42 operably coupled to cryocooler 22. The cryogenic fluid source pressure can be varied to achieve a desired temperature regulation effect in both: 1) analysis component 16b that is thermal communication with cryogenic fluid source 12 via cryogenic fluid thermal conduit 18 and 2) analysis component 16a that is in thermal communication with cryogenic fluid source 12 via a solid conduction thermal conduit 42. Cryogenic fluid source 12 can be configured as a liquefier that includes cryocooler 22 inside bucket assembly 24 that is inside vacuum housing 26. Bucket assembly 24 can include flanges 68 and 70 that are in thermal communication with analysis component 16a via a solid conduction thermal conduit(s) 42. Solid conduction thermal conduits 66 can also extend between bucket assembly 24 and cryocooler 22 to provide thermal communication between the $1^{st}$ stage bucket flange 68 and the $1^{st}$ stage of the cryocooler 62 and between the $2^{nd}$ stage bucket flange 70 and the cryocooler $2^{nd}$ stage 64.

Pressure control component 14 can include gas, for example helium, container 28, adjustable valve 30, and pressure gauge 32. Adjustable valve 30 can be adjusted to deliver gas from gas container 28 to bucket assembly 24 at the cryogenic fluid source pressure measured by pressure gauge 32. Cryocooler 22 can be configured to condense gas to create a cryogenic fluid that collects in bottom 34 of the bucket assembly 24. Cryogenic fluid in bucket assembly 24 can then be transported to analysis component 16b through cryogenic fluid thermal conduit 18.

Referring next to FIGS. 7A-C, a series of different system configurations are shown as part of the methods of the present disclosure. In these configurations, analysis component 16b in thermal communication with cryogenic fluid source 12 via a cryogenic fluid thermal conduit 18 is a sample platform in a variable temperature cryostat for example, and analysis component 16a in thermal communication with cryogenic fluid source 12 via solid conduction thermal conduit 42 are coils of a superconducting magnet. In such a system, the magnet coils must be cooled below a specific temperature at which they superconduct and are typically large in mass and take a long time to cool down. The sample platform can desirably be warmed and cooled independent of the magnet temperature and ideally takes as little time as possible to cooldown to enable rapid sample exchange.

In the context of FIGS. 7A-C, FIG. 8 depicts at least one embodiment of cooldown procedure that involves varying the pressure control of the cryogenic fluid source pressure (Pcfs) to optimize the operation and cooldown time of the magnet and sample platform independently. In Step 1 (FIG. 7A), it is desired to cool down the magnet as fast as possible while the sample platform can remain warm at room temperature (295K). To achieve this, a relatively low cryogenic fluid source pressure of 7 psia is used because the liquefaction efficiency of the cryocooler is low at this low pressure, such that a majority of the cryocooler cooling power is directed to the solid conduction thermal conduit that cools the magnet. Once the magnet is relatively cold (6K for example) it is desired to cool the sample platform as quickly as possible.

In the second step (FIG. 7B), the cryogenic fluid source pressure is increased to 15 psia. Here, the liquefaction efficiency of the cryocooler is increased such that it can produce cryogenic liquid at a high rate. More so, the mass flow rate of cryogenic fluid from the cryogenic fluid source to the sample platform is also increased at 15 psia such that a large amount of cryogenic fluid can be delivered to the sample platform to desirably cool it down in little time. Once the sample reaches its target temperature of 5K, it is desired to operate the superconducting magnet, but the magnet coils must first be cooled below 4K where the magnet coil material will superconduct.

In Step 3 (FIG. 7C) the system cooldown involves setting the cryogenic fluid source pressure to 10 psia which directs more cryocooler cooling power to the solid conduction thermal conduit to cool the magnet below 4K. Note, the sample platform no longer requires the increased liquefaction rate and mass flow rate that was used in Step 2 to cool it down quickly. The 10 psia in Step 3 is an intermediate pressure (between the 7 psia used in Step 1 that was used to cool the magnet down as quickly as possible and the 15 psia used in Step 2 to cool the platform down as quickly as possible) chosen to provide the cooling power needed to maintain the desired temperature of both the magnet and the platform.

The analysis component(s) are not limited to the specific example described and illustrated herein. The superconducting magnet system (FIGS. 7A-C) and associated cooldown procedure (FIG. 8) are just one provided example. The analysis components in FIG. 6 may comprise different components of the same instrument and could be located within the same or different vacuum spaces. Another embodiment of the system shown in FIG. 6 includes for example a sample analysis chamber, where the analysis component in thermal communication via the solid conduction thermal conduit is a charcoal getter pump used to pull vacuum on the sample chamber and the analysis component in thermal communication via the cryogenic fluid thermal link is a sample platform. In such a system, it would be desirable to pull vacuum on the sample chamber before the sample platform is cooled as to prevent potential condensation on the sample. The cooldown procedure for example may start with operating at a low cryogenic fluid source pressure to direct all or at least most of the cryogenic fluid source cooling power to the solid conduction cooling to quickly cool the charcoal getter and pull vacuum on the sample chamber. Once cold, the cryogenic fluid source pressure could be increased to direct more of the cryogenic fluid source cooling power to cryogenic fluid cooling as to quickly cool down the sample platform.

In compliance with the statute, embodiments of the invention have been described in language more or less specific as to structural and methodical features. It is to be understood, however, that the entire invention is not limited to the specific features and/or embodiments shown and/or described, since the disclosed embodiments comprise forms of putting the invention into effect.

The invention claimed is:

1. A cryogenic analytical system comprising:
a cryogenic fluid source;
one or more analysis components;
at least one cryogenic thermal conduit operably coupled between the cryogenic fluid source and the one or more analysis components, the cryogenic thermal conduit configured to convey fluid via the conduit, wherein the conduit is configured as a capillary tube or impedance tube; and
a pressure control component in fluid communication with both the cryogenic fluid source and the at least one analysis component, the pressure control component operably engaged with the cryogenic fluid source to vary the pressure of the cryogenic fluid and vary the flow of cryogenic fluid between the cryogenic fluid source and the at least one analysis component to regulate/control the temperature of the at least one analysis component.

2. The cryogenic analytical system of claim 1 wherein the cryogenic fluid source is configured to include a bucket configured to collect the cryogenic fluid.

3. The cryogenic analytical system of claim 1 wherein cryogenic fluid is conveyed between components within a closed loop system.

4. The cryogenic analytical system of claim 1 wherein the one or more analysis components is configured to regulate sample temperature.

5. The cryogenic analytical system of claim 1 wherein the one or more analysis components comprises a mass used for radiation shielding, thermal lagging, and/or sample mounting.

6. The cryogenic analytical system of claim 1 further comprising a fluid inlet operably engaged with the cryogenic fluid source, the pressure control component being operably engaged with the fluid inlet.

7. The cryogenic analytical system of claim 1 further comprising at least one solid conductive thermal conduit operably coupled between the cryogenic fluid source and the one or more analysis components.

8. The cryogenic analytical system of claim 7 wherein the cryogenic fluid source is configured as a two stage cryocooler within a bucket.

9. The cryogenic analytical system of claim 8 wherein the solid conductive thermal conduit is operably coupled to one of two stages of the two stage cryocooler.

10. The cryogenic analytical system of claim 9 wherein the bucket defines two flanges, one of the two flanges thermally connected with one of the two stages, and the other of the two flanges thermally connected with the other of the two stages.

* * * * *